United States Patent
Zhang

(10) Patent No.: US 8,710,882 B2
(45) Date of Patent: Apr. 29, 2014

(54) CALIBRATION DEVICE AND RELATED METHOD FOR PHASE DIFFERENCE BETWEEN DATA AND CLOCK

(75) Inventor: Bin Zhang, Suzhou (CN)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/607,490

(22) Filed: Sep. 7, 2012

(65) Prior Publication Data

US 2013/0063193 A1    Mar. 14, 2013

(30) Foreign Application Priority Data

Sep. 9, 2011 (CN) .......................... 2011 1 0268107

(51) Int. Cl.
 *H03L 7/06* (2006.01)
 *H03L 7/089* (2006.01)

(52) U.S. Cl.
 CPC .................................. *H03L 7/0891* (2013.01)
 USPC ....................................................... 327/156

(58) Field of Classification Search
 USPC ......... 327/147–159, 162, 163, 231, 233–237, 327/243, 244; 375/373–376; 331/1 R
 See application file for complete search history.

(56) References Cited

U.S. PATENT DOCUMENTS 6,762,945 B2 * 7/2004 Morgen .......................... 363/17
7,046,056 B2 * 5/2006 Kizer et al. ................... 327/147

* cited by examiner

*Primary Examiner* — Sibin Chen
(74) *Attorney, Agent, or Firm* — McClure, Qualey & Rodack, LLP

(57) ABSTRACT

A calibration device and related method for a phase difference between data signal and clock signal are disclosed. An apparatus of the invention includes: an adjustable delay circuit for delaying at least one of a first input signal and a second input signal according to a delay control signal, and generating a first signal and a second signal; a phase detection circuit for detecting a phase difference between the first signal and the second signal to output a phase difference signal; a charge pump and a capacitor for outputting a control signal according to the phase difference signal; a comparison circuit for outputting a comparison result according to the control signal; and, a digital control circuit for outputting the delay control signal according to the comparison result.

15 Claims, 9 Drawing Sheets

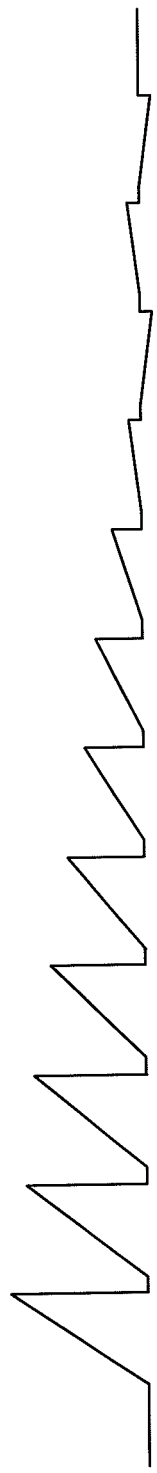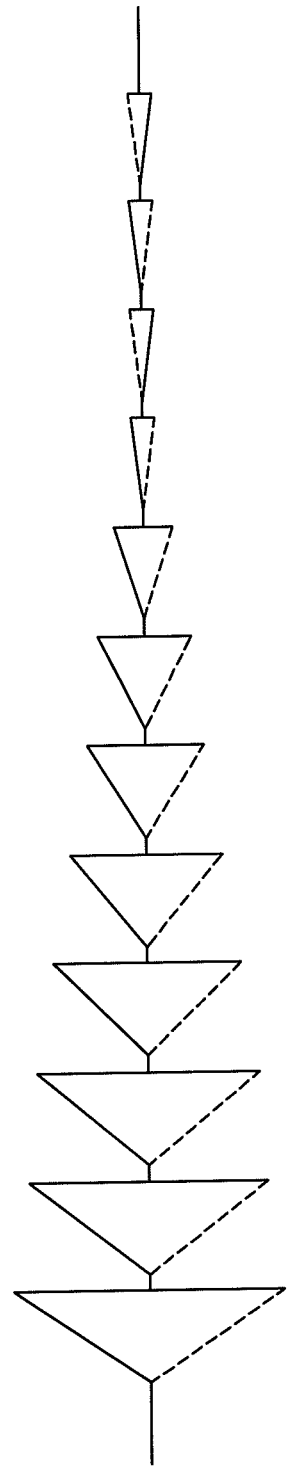
FIG. 8A
FIG. 8B

US 8,710,882 B2

CALIBRATION DEVICE AND RELATED METHOD FOR PHASE DIFFERENCE BETWEEN DATA AND CLOCK

BACKGROUND OF THE INVENTION

1. Field of the Invention

The invention relates to electronic circuits, and more particularly, to a calibration device and related methods for a phase difference between data signal and clock signal.

2. Description of the Related Art

A following situation may arise in signal transmission. A data signal and a clock signal of the same frequency are emitted by a transmitter, and a phase difference between them is $0.5\pi$ (i.e. a phase difference of 90 degrees). Thus, the clock signal edge is aligned with the center of the data signal as shown in FIG. 1A, and there are no errors when a receiver samples the data signal via the clock signal. However, the phase difference of the data signal and the clock signal appearing at the receiver may be not $0.5\pi$ (for example, as shown in FIGS. 1B and 1C) due to various causes. If the clock signal edge is close to the data signal edge, there may be a sampling error. Therefore, a device and a method are needed to calibrate the phase difference between the data signal and the clock signal at $0.5\pi$, thereby assisting in reducing probability of sampling data signal incorrectly.

Conventional techniques can not correctly sample the data signal because a frequency variation between the clock signal and the data signal is large. Therefore, an effective device and an effective method are needed to calibrate the phase difference between the data signal and the clock signal at $0.5\pi$, and to be suitable for phase calibration for the data signal and the clock signal within a large frequency band.

SUMMARY OF THE INVENTION

In view of the above mentioned problem, how to reduce or resolve the probability of incorrectly sampling the data signal to effectively improve the transmission quality needs to be addressed.

In view of the above mentioned problem, how to improve phase detection between data signal and clock signal within a large frequency band needs to be addressed.

According to an embodiment of the invention, an apparatus includes: an adjustable delay circuit for delaying at least one of a first input signal and a second input signal according to a delay control signal to generate a first delay input signal and a second delay input signal; a phase detection circuit for detecting a phase difference between the first delay input signal and the second delay input signal to output a phase difference signal; a charge pump and a capacitor for outputting a control signal according to the phase difference signal; a comparison circuit for outputting a comparison result according to the control signal; and, a digital control circuit for outputting the delay control signal according to the comparison result.

According to an embodiment of the invention, a phase calibration method includes: delaying at least one of a first input signal and a second input signal according to a delay control signal to generate a first delay input signal and a second delay input signal; detecting a phase difference between the first delay input signal and the second delay input signal to output a phase difference signal; outputting a voltage signal according to the phase difference signal; outputting a comparison result according to magnitude of the voltage signal; and, outputting the delay control signal according to the comparison result.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 8A shows voltage variations at a capacitor under the control of a digital control circuit according to a structure of FIG. 7A.

FIG. 8B shows voltage variations at a capacitor under the control of a digital control circuit according to a structure of FIG. 7B.

DETAILED DESCRIPTION OF THE INVENTION

In this specification and the appended claims, some specific words are used to describe specific elements. It should be understood by those who are skilled in the art that some hardware manufacturer may use different names to indicate the same element. In this specification and the appended claims, elements are not differentiated by their names but their functions. As used herein and in the claims, the term "comprising" is inclusive or open-ended and does not exclude additional unrecited elements, compositional components, or method steps. Besides, the term "coupling", when used herein and in the claims, refers to any direct or indirect connection means. Thus, if the specification describes a first device is coupled to a second device, it indicates that the first device can be directly connected (via signal connection, including electrical connection, wireless transmission, optical transmission, etc.) to the second device, or be indirectly connected to the second device via another device or connection means.

As used herein and in the claims, the term "and/or" includes any and all combinations of one or more of the associated listed items. The use of the terms "a" and "an" and "the" and similar referents in the context of describing the invention are to be construed to cover both the singular and the plural, unless otherwise indicated herein or clearly contradicted by context.

Figure 1A:
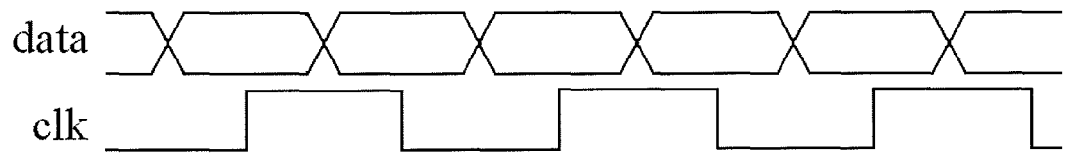
FIGS. 1A, 1B and 1C are diagrams showing different phase differences between data signal and clock signal.
Figure 1B:
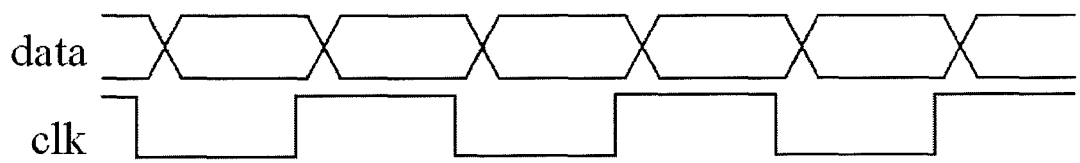
Figure 1C:
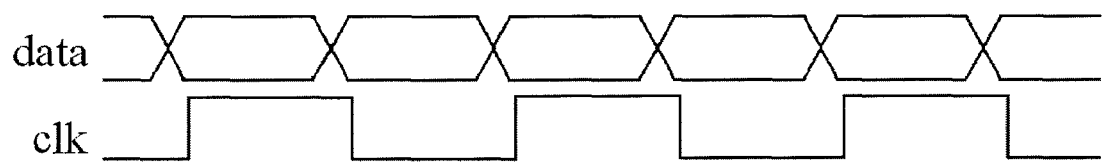
Figure 2:
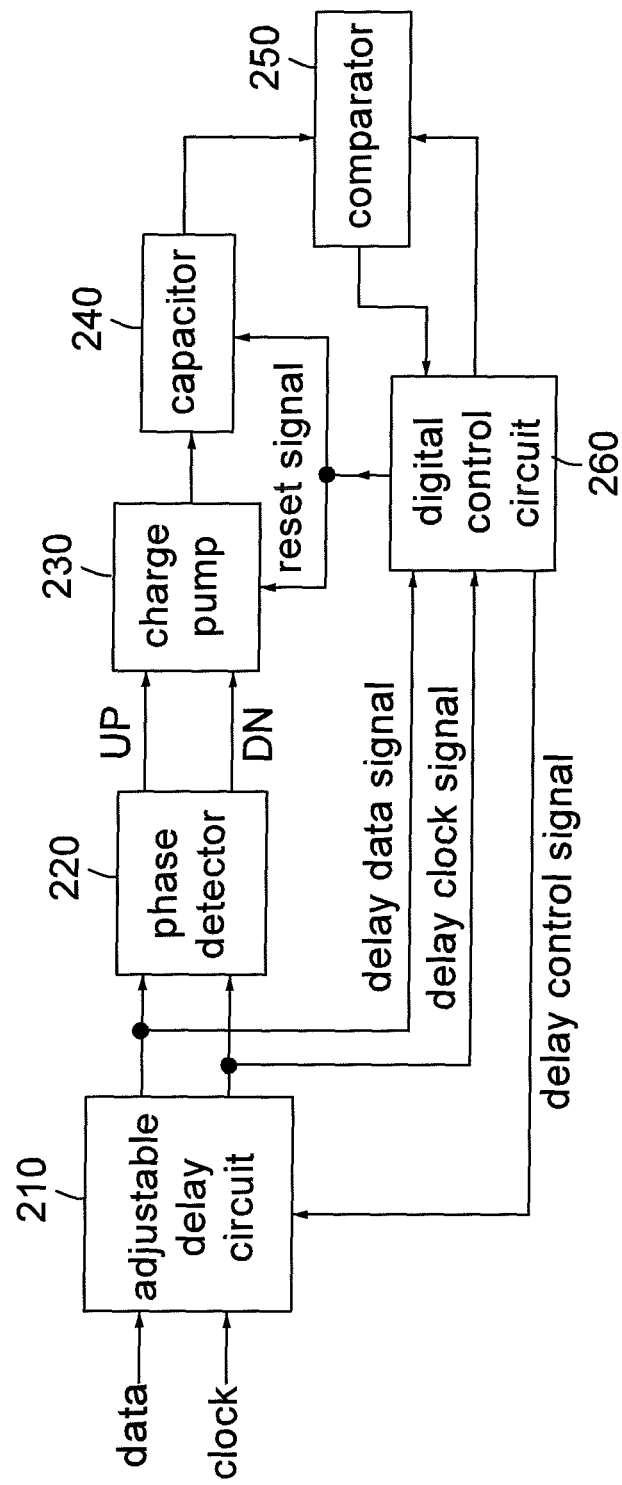
FIG. 2 shows a simplified functional block diagram of a first embodiment of a phase difference calibration device 200 according to the invention.

An embodiment of the invention is provided to perform calibration on a phase difference between data signal and clock signal to assist in correctly sampling data signal with clock signal, and to send the sampled data signal to a digital control circuit for processing. FIG. 2 shows a simplified functional block diagram according to an embodiment of a phase difference calibration device 200 of the invention. In the embodiment, the phase difference calibration device 200 includes an adjustable delay circuit 210, a phase detector 220, a charge pump 230, a capacitor 240, a comparator 250 and a digital control circuit 260. First, data signal and/or clock signal enter the adjustable delay circuit 210. If a delay control signal code is 0, the data signal and the clock signal with the unchanged phase difference are transferred to the phase detector 220. The phase detector 220 identifies a phase relationship between the data signal and the clock signal and then outputs two phase difference signals (UP/DN) indicating their phase relationship. Widths of the two signals (UP/DN) represent the phase relationship between the data signal and the clock signal. For example, FIG. 1A shows the data signal and the clock signal are in a locked state; FIG. 1B shows the data signal leads the clock signal; FIG. 1C shows the data signal lags the clock signal. The UP/DN signals containing the information of the phase difference are transferred to the charge pump 230. According to the widths of the phase difference signals (UP/DN), the charge pump 230 causes the capacitor 240 to charge or discharge, resulting in increasing or decreasing the voltage at the capacitor 240. After several cycles of charging and discharging, the comparator 250 determines a voltage condition (such as comparing the voltage at the capacitor 240 with a reference voltage Vref) and outputs a comparison signal (for example, "1" represents that the voltage at the capacitor 240 is larger than the reference voltage Vref, and "0" represents that the voltage at the capacitor 240 is small than the reference voltage Vref). According to the comparison signal, the digital control circuit 260 performs the following controls. 1. Reset the voltages at the charge pump 230 and the capacitor 240 at appropriate time points. 2. Output the delay control signal code to the adjustable delay circuit 210 to adjust the phase relationship between the data signal and the clock signal. After several cycles, the phase difference between the data signal and the clock signal can be adjusted to a suitable difference value for correct sampling. In an embodiment, the adjustable delay circuit 210 includes a first adjustable delay unit and a second adjustable delay unit (not shown), respectively controlling the delay times for the data signal and the clock signal according to the delay control signal code.

In an embodiment, the first adjustable delay unit 211 and the second adjustable delay unit 212 can be implemented respectively by a delay chain. Since there is a phase difference of $0.5\pi$ between the data signal and the clock signal in an ideal condition, a first delay chain and a second delay chain may be preset to a shortest-delay path or a bypass. The advantage of the setting is that a signal passes through the least number of circuits. In other words, the other non-working circuits need not operate so that power consumption and noise energy generated are reduced. Moreover, it is easy to control the duty cycles of the delay chain, and to adjust the delay step and the overall delay time. Therefore, the use of the delay chains increases application flexibility and reduces difficulty of circuit implementation.

An embodiment of the invention is adapted to perform calibration on a phase difference between data signal and clock signal within a large frequency band (for example, on a scale of 100 MHz-1 GHz). The description is as follows.

Figure 3:
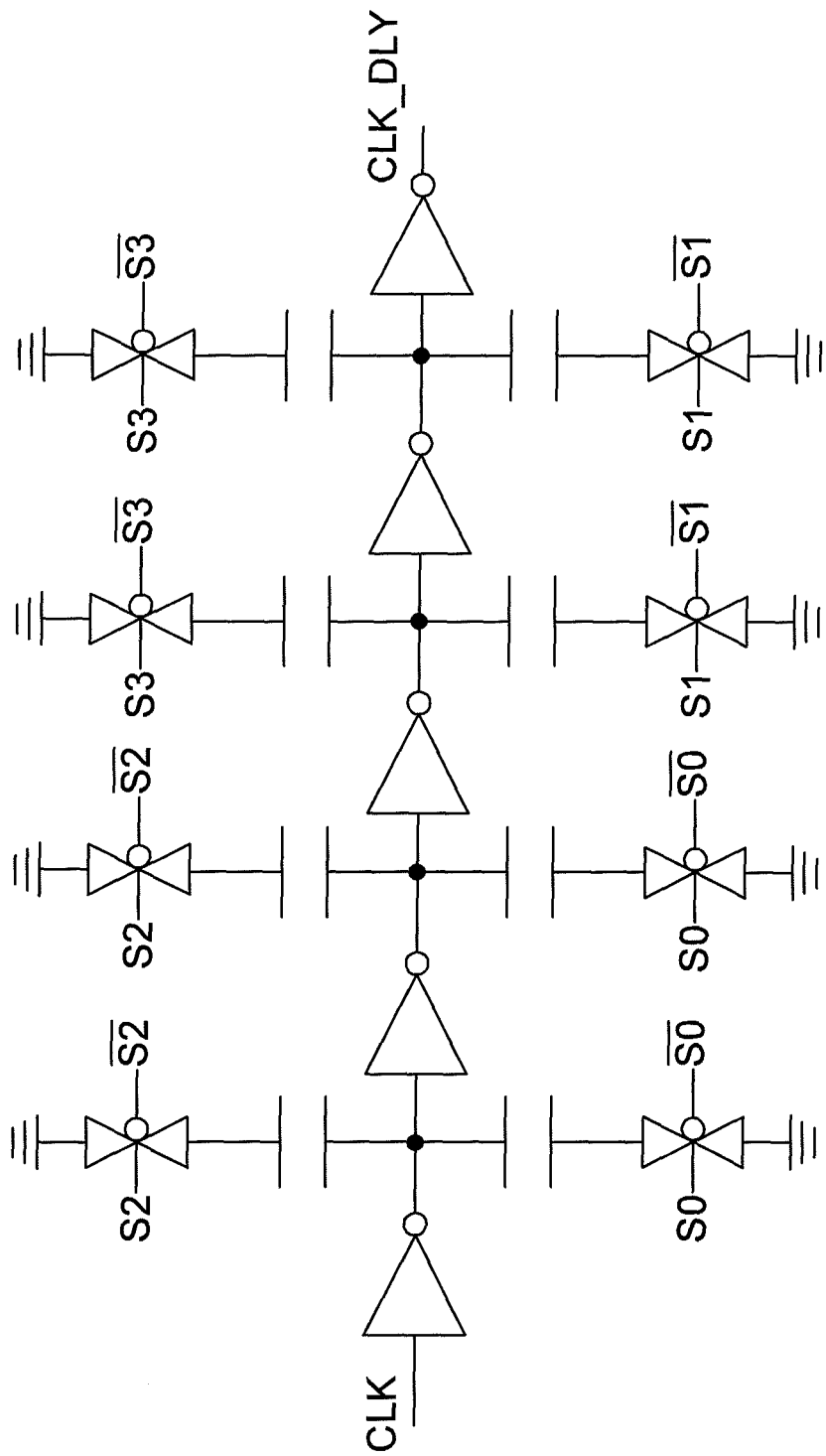
FIG. 3 shows a block diagram of a first embodiment of an adjustable delay circuit according to the invention.
Figure 4:
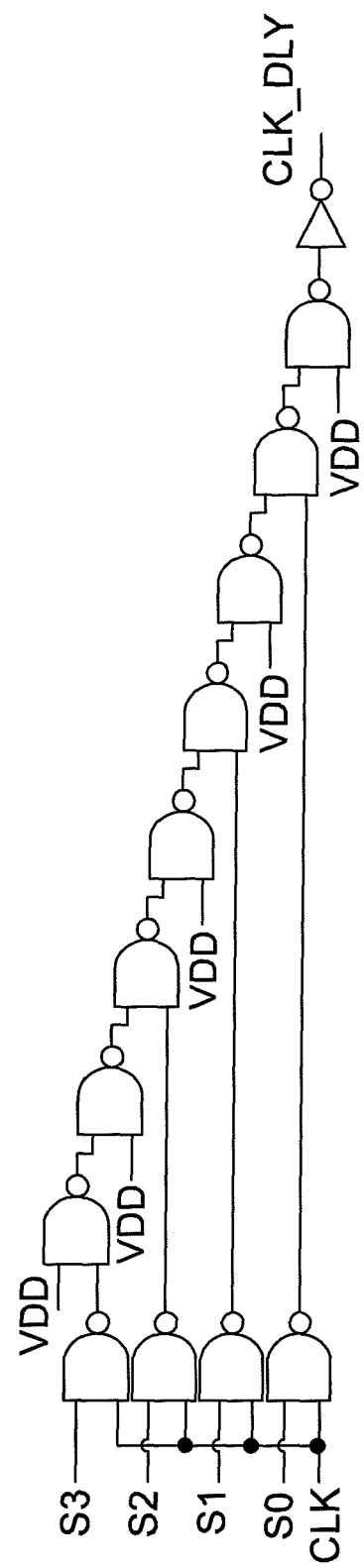
FIG. 4 shows a block diagram of a second embodiment of an adjustable delay circuit according to the invention.

1. A key of selecting a delay chain structure is determined by a delay step (amount). If the frequency is low, a resistor-capacitor delay (RC delay) method may be used to implement the adjustment of a larger delay step (for example, on a nanosecond scale), and the overall delay time can be prolonged by appropriately increasing the number of the RC delay cells connected in series as shown in FIG. 3. Here, the capacitors in FIG. 3 may have the same size, and the delay time can be controlled depending on the number of capacitors connected to the signal path. Alternatively, a size ratio of 1:2:4:8 may be used respectively for the capacitors associated with S0:S1:S2:S3 to implement the delay time adjustment of 1 to 15 delay steps. If the application frequency is higher, at least a buffer in cooperation with multiplexers or NAND gates may be used to implement delay steps with a smaller scale (on a 10 ps scale). FIG. 4 shows an exemplary implementation of a delay structure using NAND gates. Different delay times can be implemented by setting one of S0, S1, S2 and S3 to a high voltage level to cause the signal to pass through different numbers of NAND gates. If the application frequency span is very large and the time span to be adjusted is huge, a combination of the above-mentioned two structures may be used, or only the second structure (NAND gates) is used by increasing the delay cells. In an alternate embodiment, the first adjustable delay unit 211 includes at least one of a resistor-capacitor delay circuit and a plurality of NAND gates.

Figure 5:
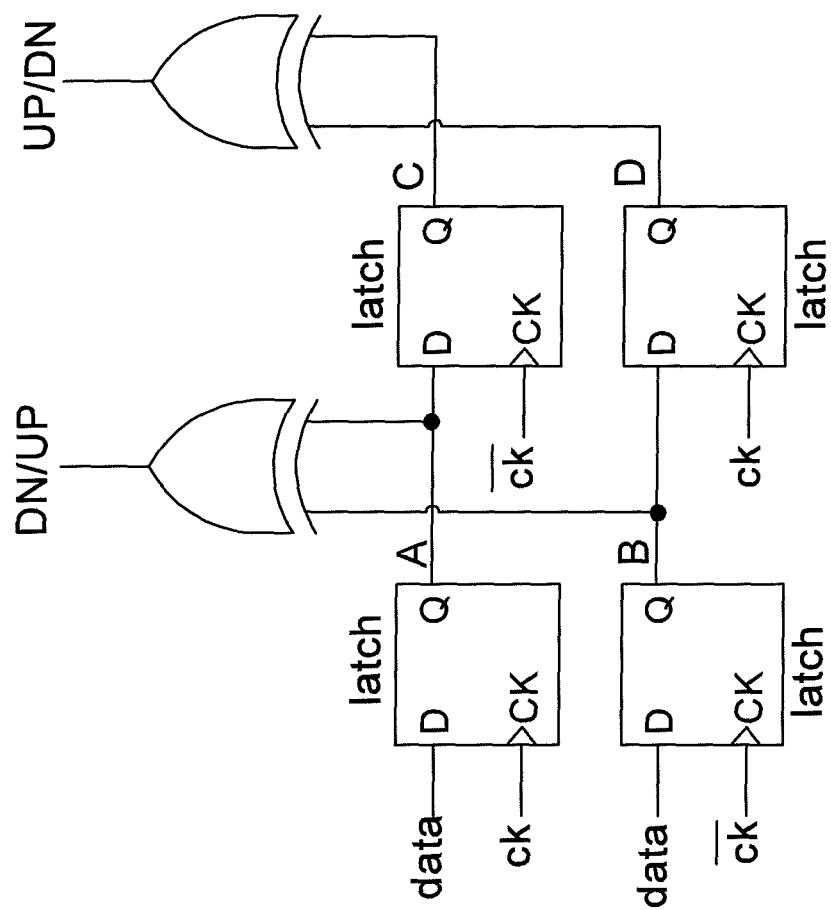
FIG. 5 shows a block diagram of a first embodiment of a phase detector according to the invention.
Figure 6:
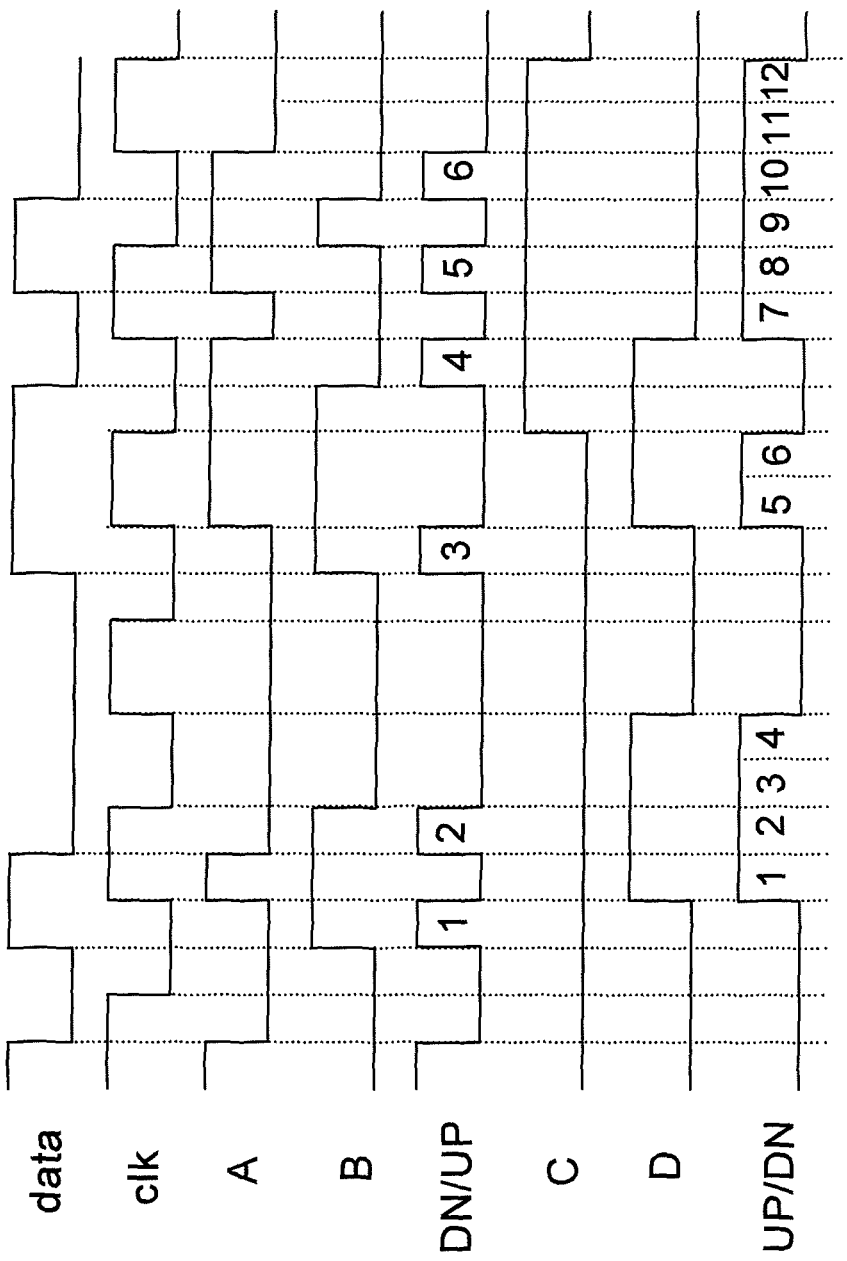
FIG. 6 shows a waveform diagram showing each node of the circuit of FIG. 5.

2. There are several embodiments for the phase detector 220. FIG. 5 shows a schematic diagram of an embodiment of the phase detector 220. If the data signal and the clock signal have an ideal phase relationship, FIG. 6 shows the waveforms at all nodes of FIG. 5 according to the circuit configuration of FIG. 5.

Figure 7A:
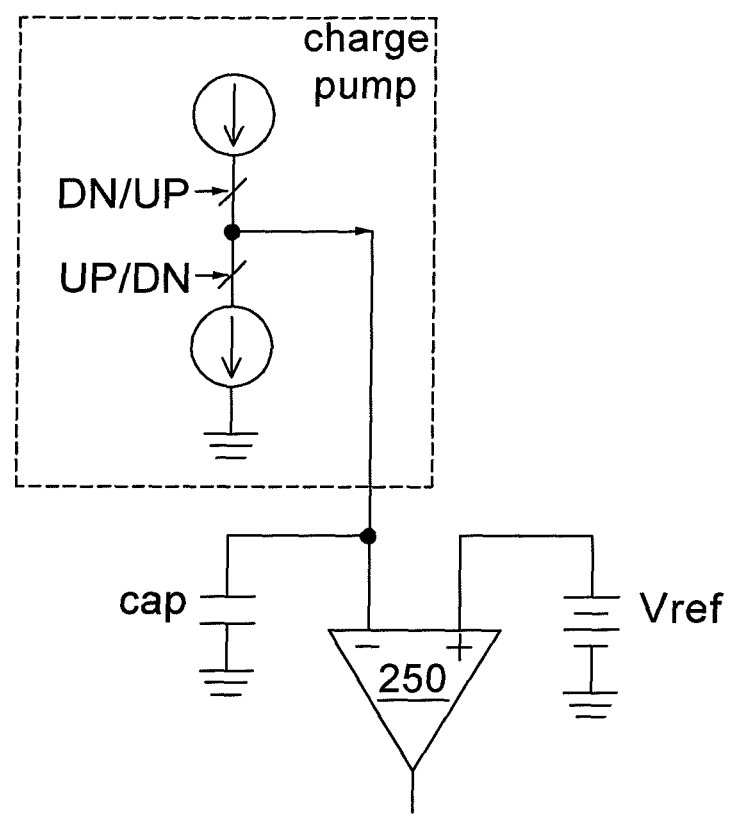
FIG. 7A shows a block diagram of a first embodiment of charge pump/capacitor/comparator according to the invention.
Figure 7B:
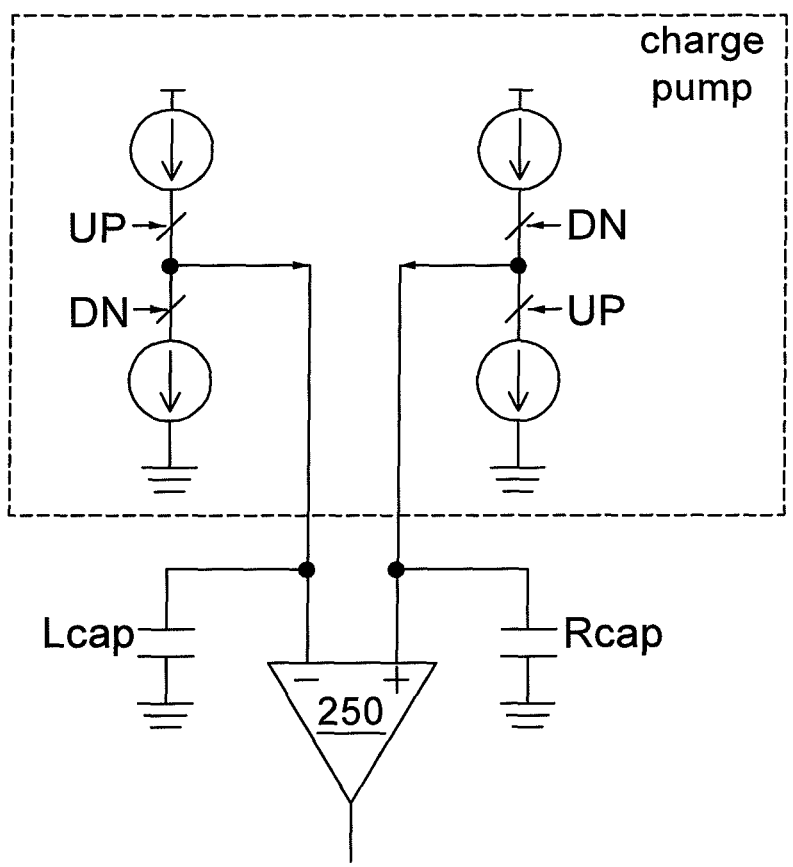
FIG. 7B shows a block diagram of a second embodiment of charge pump/capacitor/comparator according to the invention.

3. There are several embodiments for the charge pump 230, the capacitor 240 and the comparator 240. For example, FIG. 7A shows a block diagram of an embodiment of charge pump/capacitor/comparator according to the invention. FIG. 7B shows a block diagram of another embodiment of charge pump/capacitor/comparator according to the invention. In the case of an ideal phase relationship between data signal and clock signal, the widths of the UP/DN signals outputted from the phase detector 220 have a ratio of 2:1. Correspondingly, currents associated with the switches of the charge pump 230 controlled by the UP/DN signals also need to have a ratio of 2:1. For example, in a case that the signals are respectively selected from the left sides of the slash marks "UP/DN" and "DN/UP" in FIGS. 6 and 7A, a magnitude of the current controlled by the DN signal has to be twice as much as the current controlled by the UP signal in the charge pump 230 to ensure that the capacitor 240 is charged and discharged by the same amount of charge.

With the structure of FIG. 7A, after a predetermined number cycles (counted by the digital control circuit 260) of charging and discharging, the capacitor 240 has a more significant voltage variation (ensuring that the final least voltage variation meets the sensitivity requirement of the comparator 250) to cause the comparator 250 to perform a comparison operation and then transfer the result to the digital control circuit 260. The digital control circuit 260 issues a command to cause the voltage of the capacitor 240 to reset to a reference voltage Vref and adjusts the delay control signal code according to the result to output an adjusted delay control signal code to the adjustable delay circuit 210.

Then, the adjustable delay circuit 210 calibrates the data signal and the clock signal according to the adjusted delay control signal code and transfers the calibrated data and clock signals to the phase detector 220. The phase detector 220 outputs the UP/DN signals according to the calibrated data and clock signals to control the charge pump 230, and then the charge pump 230 performs the charging and discharging operations on the capacitor 240. The charging and discharging operations repeat until the adjustable delay circuit 210 reaches its limit or the comparator 250 continues outputting data signal '101010'. Then the calibration process is completed. FIG. 8A shows the voltage variation at the capacitor according to the structure of FIG. 7A.

With the structure of FIG. 7B, two sets of current sources for charging and discharging and two capacitors are needed, and two differential signals appear at two input terminals of the phase comparator 250. The capacitor voltage is reset to a common mode voltage of the comparator 250 each time the comparator 250 completes the comparison operation. An advantage is to reduce the comparator sensitivity or to shorten the time of charging and discharging cycles without changing the magnitudes of the charging and discharging currents. FIG. 8B shows the voltage variation at the capacitor according to the structure of FIG. 7B.

4. Regarding the control mechanism of the digital control circuit 260, there are various calibration modes, for example one-time calibration, periodical calibration and real-time calibration. The modes may be used depending on the logic control. A desired mode may be entered to operate on by just modifying a few parameters. The functions of the circuit are counting and encoding. Before calibration, the output voltage of the charge pump 230 (i.e. the electrode plate voltage of the capacitor 240) and the delay control signal code of the adjustable delay circuit 210 are set to Vref and 0, respectively. Then the calibration mode is entered. First, the number of the data signal edges is counted. The number of the data signal edges determines how many times the charge pump 230 charges and discharges the capacitor 240. When the number of the data signal edges reaches a predetermined number, i.e. the voltage difference between the capacitor voltage variation and the reference voltage Vref greater than the input sensitivity of the comparator 250, a command "compare" is issued to cause the comparator 250 to perform the comparison operation. Besides, according to the comparison result, the digital control circuit 260 performs logic operations to determine whether to adjust the delay amount of the data signal or the delay amount of the clock signal and then encodes the comparison result to output the delay control signal code to the adjustable delay circuit 210. During the logic operations, the digital control circuit 260 resets the charge pump 230, the capacitor 240 and the comparator 250.

After the delay control signal code is sent to the adjustable delay circuit 210, a new charging and discharging process is started again. As mentioned above, when the number of the data signal edges reaches a predetermined number, a new delay control signal code is transmitted after the above-mentioned operations. The above-mentioned process is repeated until at least one of the following conditions is satisfied. 1. The comparator 250 continues outputting the data signal "010101", indicating the clock signal edges are already aligned with the center of the data signal. 2. The delay control signal code reaches its limit. For example, S[3:0]=1111, representing that the adjustable delay circuit 210 reaches the upper limit of its adjustable range. If the total amount of the adjustable delay time of the adjustable delay circuit 210 is large enough, correct data signal reception is not affected even though the condition "2" arises. When at least one of the conditions "1" and "2" arises, the digital control circuit 260 generates a signal to stop the calibration process. When the calibration is completed, sampling effective data of the data signal can be correctly performed by using the clock signal edge to further generate correctly sampled data signal. The periodical calibration or the real-time calibration is merely a repetition of the above-mentioned process.

Besides, according to various application requirements, the functions of the charge pump 230, the capacitor 240 and the comparator 250 can be properly designed together with the logic of the digital control circuit 260 capable of realizing the one-time calibration, the periodical calibration and the real-time calibration, thereby rendering embodiments of the invention more flexible.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An apparatus, comprising:
   an adjustable delay circuit for receiving a data signal and a clock signal, delaying at least one of the data signal and the clock signal according to a delay control signal, and generating a delayed data signal and a delayed clock signal;
   a phase detection circuit, coupled to the adjustable delay circuit, for receiving the delayed data signal and the delayed clock signal, and detecting a phase difference between the delayed data signal and the delayed clock signal to output a phase difference signal;
   a charge pump and a capacitor, coupled to the phase detection circuit, for outputting a control signal according to the phase difference signal;
   a comparison circuit, coupled to the capacitor, for outputting a comparison result according to the control signal; and
   a digital control circuit, coupled to the comparison circuit, for generating the delay control signal according to the comparison result.

2. The apparatus of claim 1, wherein the adjustable delay circuit comprises: a first adjustable delay unit for delaying the first input signal according to the delay control signal; and a second adjustable delay unit for delaying the second input signal according to the delay control signal.

3. The apparatus of claim 2, wherein the first adjustable delay unit comprises at least one of a resistor-capacitor delay circuit and a plurality of NAND gates.

4. The apparatus of claim 2, wherein the first adjustable delay unit comprises a buffer and a multiplexer.

5. The apparatus of claim 1, wherein the adjustable delay circuit comprises a first adjustable delay unit and a second adjustable delay unit, wherein the first adjustable delay unit has a first delay amount and the second adjustable delay unit has a second delay amount, and wherein the first delay amount and the second delay amount are different.

6. The apparatus of claim 5, wherein the first delay amount of the first adjustable delay unit is on a nanosecond scale, and the second delay amount of the second adjustable delay unit is on a picosecond scale.

7. The apparatus of claim 1, wherein the adjustable delay circuit is a delay chain.

8. The apparatus of claim 1, wherein the digital control circuit performs at least one of one-time calibration, periodical calibration and real-time calibration.

9. The apparatus of claim 1, wherein the digital control circuit outputs a reset signal to reset a voltage at the capacitor to a predetermined voltage.

10. The apparatus of claim 1, wherein the digital control circuit outputs a reset signal to reset a voltage at the capacitor to a common mode voltage of the comparison circuit.

11. A phase calibration method, comprising:
    receiving a data signal and a clock signal;

delaying at least one of the data signal and the clock signal according to a delay control signal to generate a delayed data signal and a delayed clock signal;

detecting a phase difference between the delayed data signal and the delayed clock signal to output a phase difference signal;

outputting a voltage signal according to the phase difference signal;

comparing the voltage signal with a reference voltage to output a comparison result; and outputting the delay control signal according to the comparison result.

12. The method of claim 11, wherein the step of delaying at least one of the first input signal and the second input signal further comprises: delaying the first input signal according to the delay control signal; and delaying the second input signal according to the delay control signal.

13. The method of claim 12, wherein the step of delaying the first input signal according to the delay control signal further comprises: selecting a first delay circuit or a second delay circuit to delay the first input signal; and wherein a first delay amount of the first delay circuit and a second delay amount of the second delay circuit are different.

14. The method of claim 13, wherein the first delay amount of the first delay circuit belongs to a nanosecond scale, and the second delay amount of the second delay circuit belongs to a picosecond scale.

15. The method of claim 11, which is at least one of one-time calibration, periodical calibration and real-time calibration.

* * * * *